US010486208B2

(12) United States Patent
Ogata et al.

(10) Patent No.: US 10,486,208 B2
(45) Date of Patent: Nov. 26, 2019

(54) SUBSTRATE PROCESSING APPARATUS, METHOD OF CLEANING SUBSTRATE PROCESSING APPARATUS, AND STORAGE MEDIUM

(71) Applicant: Tokyo Electron Limited, Tokyo (JP)

(72) Inventors: Nobuhiro Ogata, Kumamoto (JP); Norihiro Ito, Kumamoto (JP); Jiro Higashijima, Kumamoto (JP); Yusuke Hashimoto, Kumamoto (JP); Kazuhiro Aiura, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 207 days.

(21) Appl. No.: 15/624,822

(22) Filed: Jun. 16, 2017

(65) Prior Publication Data

US 2017/0361364 A1    Dec. 21, 2017

(30) Foreign Application Priority Data

Jun. 21, 2016    (JP) .................. 2016-122768

(51) Int. Cl.
*B08B 13/00* (2006.01)
*B08B 3/04* (2006.01)
*B08B 3/08* (2006.01)
*H01L 21/67* (2006.01)

(52) U.S. Cl.
CPC .............. *B08B 13/00* (2013.01); *B08B 3/041* (2013.01); *B08B 3/08* (2013.01); *H01L 21/67017* (2013.01); *H01L 21/67051* (2013.01); *H01L 21/67173* (2013.01)

(58) Field of Classification Search
CPC ..................................... B08B 13/00
See application file for complete search history.

(56) References Cited

U.S. PATENT DOCUMENTS

2014/0014134 A1*  1/2014  Ogata ............... B08B 3/04
                                                     134/6
2016/0064256 A1*  3/2016  Amano ............ H01L 21/6715
                                                     134/138

FOREIGN PATENT DOCUMENTS

JP    2000-315671 A    11/2000
JP    2014-130935 A    7/2014

* cited by examiner

*Primary Examiner* — Jason Y Ko
(74) *Attorney, Agent, or Firm* — Abelman, Frayne & Schwab

(57) ABSTRACT

According to the present disclosure, both first and second cup bodies are brought into a state of being close to each other by lifting one of the first and second cup bodies. A first gap between a gap forming portion formed on the lower surface of a first protruding portion and the upper surface of a second protruding portion is narrower than a second gap between a portion of the first protruding portion where the gap forming portion is absent, and the upper surface of the second protruding portion. In this state, a cleaning liquid is supplied to the second gap. Since movement of the cleaning liquid that tends to flow radially outward is restricted by the first narrow gap, the entire area between the first and second protruding portions may be filled with the cleaning liquid so that the surface to be cleaned may be evenly cleaned.

14 Claims, 6 Drawing Sheets

SUBSTRATE PROCESSING APPARATUS, METHOD OF CLEANING SUBSTRATE PROCESSING APPARATUS, AND STORAGE MEDIUM

CROSS-REFERENCE TO RELATED APPLICATIONS

This application is based on and claims priority from Japanese Patent Application No. 2016-122768, filed on Jun. 21, 2016, with the Japan Patent Office, the disclosure of which is incorporated herein in its entirety by reference.

TECHNICAL FIELD

The present disclosure relates to a technology of cleaning a cup body that receives a processing liquid scattering from a rotating substrate in a substrate processing apparatus.

BACKGROUND

In manufacturing a semiconductor device, a liquid processing is performed on a surface of a substrate (e.g., a semiconductor wafer) by supplying a processing liquid such as, for example, a chemical liquid to the surface of the substrate. The processing liquid that scatters from the substrate by the centrifugal force after being supplied to the rotating substrate is received by a recovery cup disposed around the substrate. In general, the recovery cup is composed of a plurality of cup bodies that are relatively vertically movable. Each cup body includes a cylindrical portion that has a substantially cylindrical shape, and an inclined protruding portion that protrudes radially inward from the top end of the cylindrical portion.

The chemical liquid scattering in a mist or droplet form from the substrate easily remains on the surface of the protruding portion. When the chemical liquid remaining on the surface of the protruding portion or a reaction product contained in the chemical liquid is solidified on the protruding portion, and then, peeled off therefrom, this causes attachment of particles to the substrate. Hence, the cup body, especially, the protruding portion is periodically cleaned.

A method of cleaning members around the substrate, including the protruding portion of the cup body, is known from Japanese Laid-Open Patent Publication Nos. 2000-315671 and 2014-130935 and others. A cleaning liquid is supplied to a cleaning jig that is held and rotated by a substrate holder, and the cleaning liquid scatters from the cleaning jig by the centrifugal force. The cleaning jig is provided with a guide surface (e.g., an inclined surface) that guides the scattering of the cleaning liquid. By adjusting, for example, a rotation speed of the cleaning jig and a supply flow rate of the cleaning liquid, the cleaning liquid may be caused to scatter at various heights or angles.

However, the above-described related art needs be improved in evenly cleaning the protruding portion of the cup body of the recovery cup.

SUMMARY

An exemplary embodiment of the present disclosure provides a substrate processing apparatus including: a substrate holding unit that holds a substrate horizontally; a processing liquid nozzle that supplies a processing liquid to the substrate held by the substrate holding unit; a recovery cup that is provided around the substrate holding unit and includes a first cup body and a second cup body that receive the processing liquid scattering from the substrate, wherein the first cup body includes a first cylindrical portion and a first protruding portion that extends radially inward from a top end of the first cylindrical portion, the second cup body includes a second cylindrical portion and a second protruding portion that extends radially inward from a top end of the second cylindrical portion, the first cylindrical portion is positioned radially outside the second cylindrical portion, the first protruding portion is positioned above the second protruding portion, and an upper surface of the second protruding portion is inclined to ascend radially inward; and a lifting mechanism that vertically moves at least one of the first cup body and the second cup body so as to take a first state where the first protruding portion and the second protruding portion are spaced apart from each other, and a second state where the first protruding portion and the second protruding portion are closer to each other than those in the first state, wherein, in the second state, a first gap is formed between a lower surface of the first protruding portion and the upper surface of the second protruding portion, a second gap is formed radially inside from the first gap between the lower surface of the first protruding portion and the upper surface of the second protruding portion, the first gap is narrower than the second gap, and the substrate processing apparatus further includes a cleaning liquid nozzles that supply a cleaning liquid to the second gap.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
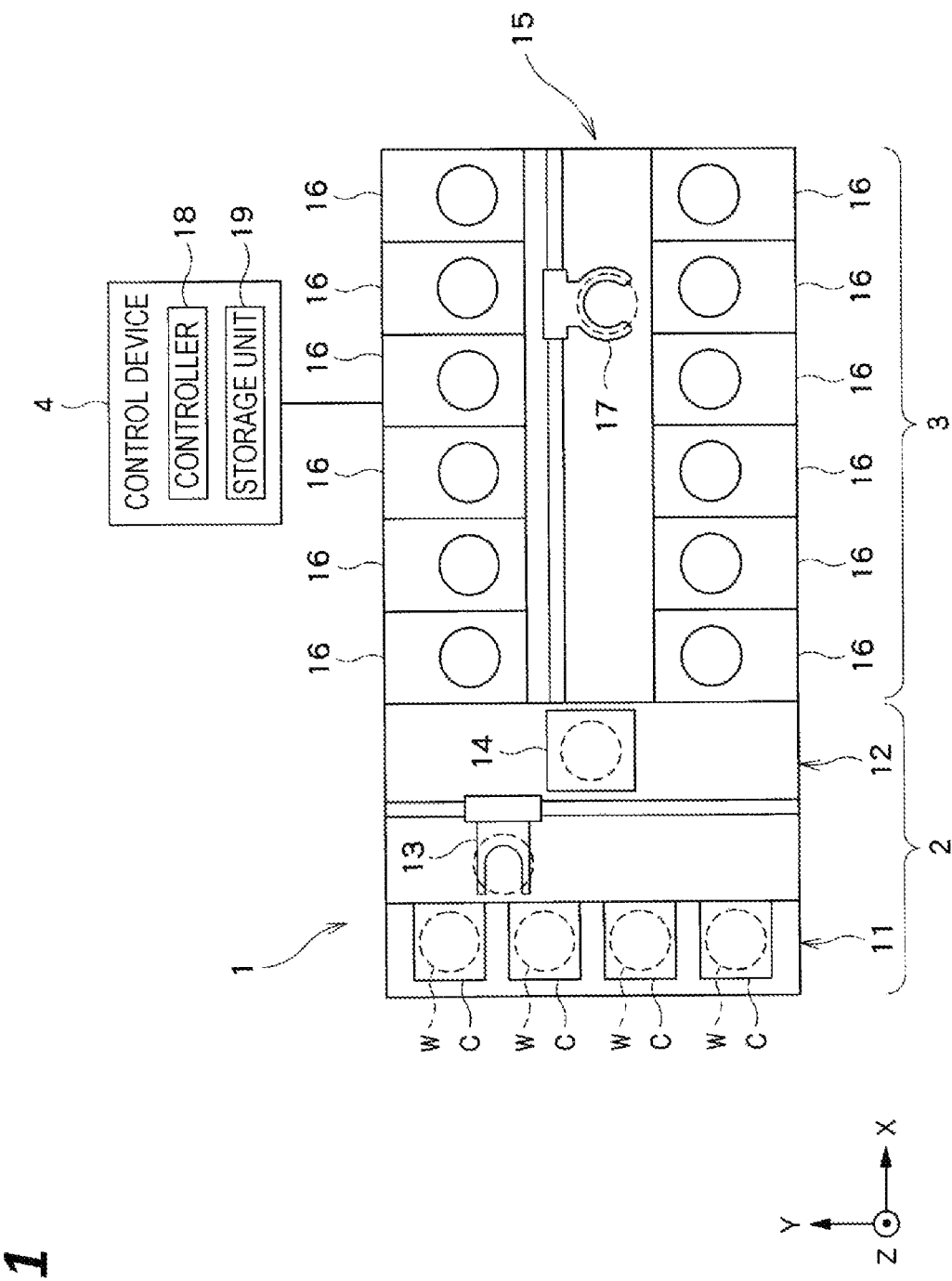
FIG. 1 is a plan view schematically illustrating the entire configuration of a substrate processing system according to an exemplary embodiment of a substrate processing apparatus of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

An object of the present disclosure is to provide a technology capable of evenly cleaning a protruding portion of a cup body of a recovery cup.

An exemplary embodiment of the present disclosure provides a substrate processing apparatus including: a substrate holding unit that holds a substrate horizontally; a processing liquid nozzle that supplies a processing liquid to the substrate held by the substrate holding unit; a recovery cup that is provided around the substrate holding unit and includes a first cup body and a second cup body that receive the processing liquid scattering from the substrate, wherein the first cup body includes a first cylindrical portion and a first protruding portion that extends radially inward from a top end of the first cylindrical portion, the second cup body includes a second cylindrical portion and a second protruding portion that extends radially inward from a top end of the second cylindrical portion, the first cylindrical portion is positioned radially outside the second cylindrical portion, the first protruding portion is positioned above the second protruding portion, and an upper surface of the second protruding portion is inclined to ascend radially inward; and a lifting mechanism that vertically moves at least one of the first cup body and the second cup body so as to take a first state where the first protruding portion and the second protruding portion are spaced apart from each other, and a second state where the first protruding portion and the second protruding portion are closer to each other than those in the first state, wherein, in the second state, a first gap is formed between a lower surface of the first protruding portion and the upper surface of the second protruding portion, a second gap is formed radially inside from the first gap between the lower surface of the first protruding portion and the upper surface of the second protruding portion, the first gap is narrower than the second gap, and the substrate processing apparatus further includes a cleaning liquid nozzles that supply a cleaning liquid to the second gap.

In the above-described substrate processing apparatus, the first protruding portion includes a radially extending radial groove that is formed on the lower surface thereof which corresponds to the first gap, to guide the cleaning liquid supplied from the plurality of cleaning liquid nozzles into the second gap.

In the above-described substrate processing apparatus, the cleaning liquid nozzle is provided at a position facing the radial groove in the second protruding portion.

In the above-described substrate processing apparatus, the first protruding surface includes a circumference groove that is formed on the lower surface thereof which corresponds to the first gap, to extend circumferentially while crossing the radial groove.

In the above-described substrate processing apparatus, in the second state, a radial inner end of the first protruding portion and a radial inner end of the second protruding portion are in contact with each other.

In the above-described substrate processing apparatus, the first protruding portion includes a gap forming portion that is provided in a downwardly convex annular shape on the lower surface thereof such that the first gap is narrower than the second gap, and the radial groove and the circumference groove are formed in the gap forming portion.

Another exemplary embodiment of the present disclosure provides a method of cleaning a substrate processing apparatus comprising: a substrate holding unit that holds a substrate horizontally; a processing liquid nozzle that sup- plies a processing liquid to the substrate held by the substrate holding unit; a recovery cup that is provided around the substrate holding unit and includes a first cup body and a second cup body that receive the processing liquid scattering from the substrate, wherein the first cup body includes a first cylindrical portion and a first protruding portion that extends radially inward from a top end of the first cylindrical portion, the second cup body includes a second cylindrical portion and a second protruding portion that extends radially inward from a top end of the second cylindrical portion, the first cylindrical portion is positioned radially outside the second cylindrical portion, the first protruding portion is positioned above the second protruding portion, and an upper surface of the second protruding portion is inclined to ascend radially inward; and a lifting mechanism that vertically moves at least one of the first cup body and the second cup body so as to take a first state where the first protruding portion and the second protruding portion are spaced apart from each other, and a second state where the first protruding portion and the second protruding portion are closer to each other than those in the first state, wherein in the second state, a first gap is formed between a lower surface of the first protruding portion and the upper surface of the second protruding portion, a second gap is formed radially inside from the first gap between the lower surface of the first protruding portion and the upper surface of the second protruding portion, the first gap is narrower than the second gap, and the substrate processing apparatus further includes a cleaning liquid nozzle that supplies a cleaning liquid to the second gap, wherein the method comprises: establishing the second state by vertically moving at least one of the first cup body and the second cup body; and supplying the cleaning liquid from the plurality of cleaning liquid nozzles to the second gap.

In the above-described method, the first protruding portion includes a radially extending radial groove that is formed on the lower surface thereof which corresponds to the first gap, and the supplying the cleaning liquid includes guiding the cleaning liquid supplied from the cleaning liquid nozzles into the second gap through the plurality of radial grooves.

In the above-described method, the first protruding portion includes a plurality of radial grooves that are provided on the lower surface thereof, the plurality of cleaning liquid nozzles are provided at positions facing the plurality of radial grooves, respectively, and the supplying the cleaning liquid includes guiding the cleaning liquid supplied from the plurality of cleaning liquid nozzles into the second gap through the corresponding radial grooves, respectively.

In the above-described method, the first protruding surface includes a circumference groove that is formed on the lower surface thereof which corresponds to the first gap, to extend circumferentially while crossing the radial groove, and the supplying the cleaning liquid causing the cleaning liquid supplied from the cleaning liquid nozzles to flow into the circumference groove and to be diffused circumferentially through the circumference groove.

In the above-described method, the establishing the second state includes causing a radial inner end of the first protruding portion and a radial inner end of the second protruding portion to be in contact with each other.

Still another exemplary embodiment of the present disclosure provides a non-transitory computer-readable storage medium storing a program that, when executed by a computer that controls an operation of a substrate processing apparatus, causes the computer to control the substrate processing apparatus so as to execute a method of cleaning the substrate processing apparatus.

According to the above-described exemplary embodiments of the present disclosure, a protruding portion of a cup body of a recovery cup may be evenly cleaned.

Hereinafter, exemplary embodiments of the present disclosure will be described with reference to the accompanying drawings.

FIG. 1 is a view illustrating an outline of a substrate processing system according to an exemplary embodiment of the present disclosure. In the following, in order to clarify positional relationships, the X-axis, Y-axis, and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and a processing station 3 are provided adjacent to each other.

The carry-in/out station 2 is provided with a carrier placing section 11 and a transfer section 12. In the carrier placing section 11, a plurality of carriers C is placed to accommodate a plurality of substrates (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a controller 18 and a storage unit 19. The storage unit 19 stores a program that controls various processings performed in the liquid processing system 1. The controller 18 controls the operations of the substrate processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Next, the configuration of each processing unit 16 will be described with reference to FIG. 2.

Figure 2:
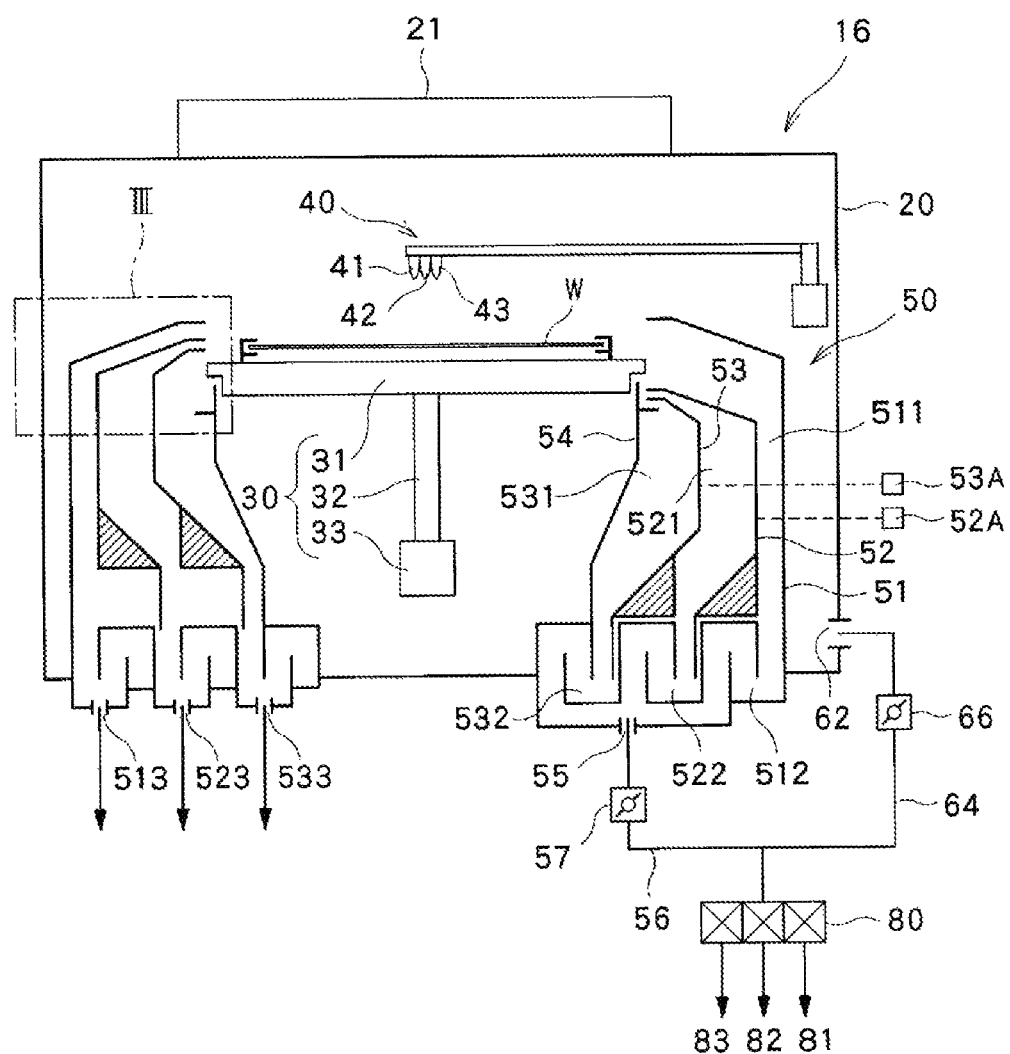
FIG. 2 is a vertical sectional view schematically illustrating a configuration of a processing unit included in the substrate processing system of FIG. 1.

As illustrated in FIG. 2, each processing unit 16 includes a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 includes a substrate holding unit 31, a rotation axis 32, and a rotation driving unit 33. The substrate holding unit 31 holds the wafer W horizontally, and the rotation driving unit 33 rotates the wafer W around the vertical axis through the rotation axis 32.

The processing fluid supply unit 40 supplies a processing fluid (e.g., a processing liquid or processing gas) onto the wafer W. The processing fluid supply unit 40 is provided with a plurality of processing liquid nozzles 41, 42, and 43 that eject (supplies) a processing liquid toward the wafer W held and rotated on the substrate holding unit 31. For example, any one of an acidic cleaning liquid (e.g., dilute hydrofluoric acid (DHF)) and deionized water (DIW, i.e., pure water) is selectively ejected from the processing liquid nozzle 41, any one of an alkaline cleaning liquid (e.g., SC-1) and DIW is selectively ejected from the processing liquid nozzle 42, and a drying assistance organic solvent (e.g., isopropyl alcohol (IPA)) is ejected from the processing liquid nozzle 43. The processing liquids are supplied to the processing liquid nozzles 41 to 43, respectively, from a processing liquid supply mechanism (not illustrated) provided with a processing liquid supply path that is connected to a processing liquid supply source and has a flow rate regulator such as, for example, an opening/closing valve or a flow rate regulating valve interposed therein.

The recovery cup 50 includes a plurality of cup bodies, that is, three cup bodies 51, 52, and 53 in the illustrated example, and at least one (two in the illustrated example) of the three cup bodies is movable for switching a flow path. Specifically, the recovery cup 50 includes a first annular stationary cup body 51 that is positioned outermost, a second annular vertically movable cup body 52 that is positioned inside the first cup body 51, a third annular vertically movable cup body 53 that is positioned inside the second cup body 52, and a stationary inner wall 54 that is positioned inside the third cup body 53.

Figure 3:
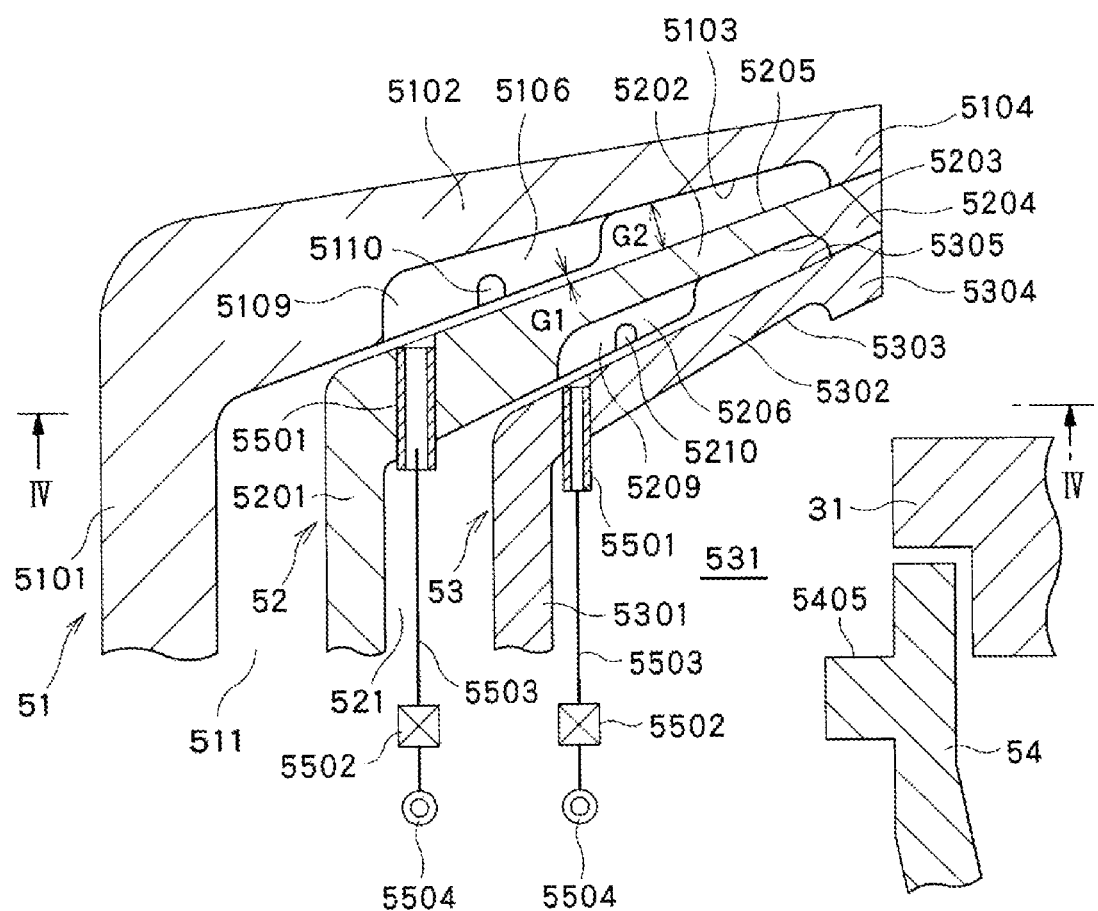
FIG. 3 is a vertical sectional view specifically illustrating area III in FIG. 2 in an enlarged scale.

As illustrated in FIG. 3, the first cup body 51 includes a cylindrical portion 5101 and a ring-shaped (annular) protruding portion 5102 that protrudes radially inward from the top end of the cylindrical portion 5101. The second cup body 52 includes a cylindrical portion 5201 and a ring-shaped (annular) protruding portion 5202 that protrudes radially inward from the top end of the cylindrical portion 5201. The third cup body 53 includes a cylindrical portion 5301 and a ring-shaped (annular) protruding portion 5302 that protrudes radially inward from the top end of the cylindrical portion 5301. The upper surfaces of the protruding portions 5102, 5202, and 5302 are inclined to ascend radially inward.

In addition, in this disclosure, the terms "radial (diameter) direction" and "circumferential (peripheral) direction" as a whole substantially indicate a radial (or diameter) direction and a circumferential direction based on the central axis (which is the same as the rotation central axis of the substrate holding unit 31) of the recovery cup formed as a rotating body (a rotating body in the geometric terminology), unless otherwise specified.

The second cup body 52 and the third cup body 53 are vertically moved by lifting mechanisms 52A and 53A schematically illustrated in FIG. 2, respectively. In FIG. 2, the left side represents the second cup body 52 and the third cup body 53 both in the upwardly moved position, and the right side represents the second cup body 52 and the third cup body 53 both in the downwardly moved position. The first to third cup bodies 51 to 53 and the inner wall 54 are not rotated. A first flow path 511 is formed between the first cup body 51 and the second cup body 52, a second flow path 521 is formed between the second cup body 52 and the third cup body 53, and a third flow path 531 is formed between the third cup body 53 and the inner wall 54.

At the bottom portion of the recovery cup 50, a cup exhaust port 55 is formed to communicate with the first flow path 511, the second flow path 521, and the third flow path 531. A cup exhaust line 56 is connected to the cup exhaust port 55. A butterfly valve 57 is interposed in the cup exhaust line 56, and an exhaust flow rate from the recovery cup 50 through the cup exhaust line 56 may be regulated by adjusting the opening degree of the butterfly valve 57.

A curved portion is provided in the middle of each of the first flow path 511, the second flow path 521, and the third flow path 531, and when the path direction rapidly changes in the curved portion, a liquid component is separated from a gas-liquid mixed fluid flowing in each of the paths. The separated liquid component drops into a liquid receiver 512 corresponding to the first flow path 511, a liquid receiver 522 corresponding to the second flow path 521, and a liquid receiver 532 corresponding to the third flow path 531. The liquid receivers 512, 522, and 532 are connected to an acidic liquid draining system, an alkaline liquid draining system, an organic-based liquid draining system (none of which is illustrated) of a plant through drain ports 513, 523, and 533, respectively.

By relatively vertically moving the first cup body 51 and the second cup body 52, the first cup body 51 and the second cup body 52 may take a first state where the protruding portions 5102 and 5202 thereof are spaced apart from each other, and a second state where the protruding portions 5102 and 5202 are closer to each other than those in the first state. Further, by relatively vertically moving the second cup body 52 and the third cup body 53, the second cup body 52 and the third cup body 53 may take a third state where the protruding portions 5202 and 5302 thereof are spaced apart from each other, and a fourth state where the protruding portions 5202 and 5302 are closer to each other than those in the third state.

Downward protrusions 5104, 5204, and 5304 are formed at the tip ends (the inner peripheral ends) of the lower surfaces 5103, 5203, and 5303 of the protruding portions 5102, 5202, and 5302, respectively, and when the first cup body 51 and the second cup body 52 are in the second state, the protrusion 5104 of the first cup body 51 is brought into a contact with the tip end (the inner peripheral end) of the upper surface 5205 of the second cup body 52, and as a result, the first flow path 511 between the first cup body 51 and the second cup body 52 is closed. Further, when the second cup body 52 and the third cup body 53 are in the fourth state, the protrusion 5204 of the second cup body 52 is brought into a contact with the tip end (the inner peripheral end) of the upper surface 5305 of the third cup body 53, and as a result, the second flow path 521 between the second cup body 52 and the third cup body 53 is closed.

When the third cup body 53 is disposed at the downwardly moved position, the protrusion 5304 of the third cup body 53 is brought into a contact with a receiving surface 5405 provided in a circumferential protrusion form on the inner wall 54, and as a result, the third flow path 531 between the third cup body 53 and the inner wall 54 is closed.

A ring-shaped (annular) gap forming portion 5106 (a downwardly protruding portion) is provided on the lower surface 5103 of the protruding portion 5102 to extend radially inward from the inner circumferential surface of the cylindrical portion 5101 of the first cup body 51, within the ring-shaped (annular) area where the first cup body 51 and the second cup body 52 are vertically superimposed on each other (excluding the area where the protrusion 5104 is provided). The gap forming portion 5106 is circumferentially and continuously provided over the entire circumference of the protruding portion 5102. As illustrated in FIG. 3, when the first cup body 51 and the second cup body 52 are in the second state, a gap G1 between the lower surface of the gap forming portion 5106 and the upper surface of the protruding portion 5202 is narrower than a gap G2 between the lower surface of the portion of the protruding portion 5102 where the gap forming portion 5106 is absent (radially inside from the gap forming portion 5106) and the upper surface of the protruding portion 5202.

The size of the gap G1 is required to be large to the extent that the cleaning liquid may spread in the entire area of the gap G1, but have a small value to the extent that the cleaning liquid does not easily flow out from the gap G1, for example, about 0.1 mm to about 0.5 mm.

In the descriptions above, the two portions, that is, the ring-shaped protrusion 5104 and the gap forming portion 5106 are provided on the lower surface 5103 of the protruding portion 5012 of the first cup body 51. However, this configuration may also be regarded as providing a ring-shaped wide groove at the portion of the lower surface 5103 corresponding to the gap G2.

A plurality of cleaning liquid nozzles 5501, that is, four cleaning liquid nozzles 5501 (not limited to this number) in the illustrated example are provided in the protruding portion 5202 of the second cup body 52 to eject a cleaning liquid such as, for example, DIW. The plurality of, for example, four cleaning liquid nozzles 5501 are provided, for example, at the same radial position at equal intervals in the circumferential direction. Each cleaning liquid nozzle 5501 may be formed by, for example, a pipe-like member embedded in a through hole bored in the protruding portion 5102. A cleaning liquid is supplied to each cleaning liquid nozzle 5501 from a cleaning liquid supply source 5504 through a cleaning liquid line 5503 in which an opening/closing valve 5502 is interposed as schematically illustrated in FIG. 3.

A plurality of radial grooves 5109 are formed on the lower surface of the gap forming portion 5106 to guide the cleaning liquid supplied from the cleaning liquid nozzles 5501 into the gap G2. The gap between the groove bottom surfaces (the upper end surfaces) of the radial grooves 5109 and the upper surface of the protruding portion 5202 facing the groove bottom surfaces is wider than the gap G1. The radial grooves 5109 extend radially inward to communicate with the gap G2. The number of the radial grooves 5109 is the same as that of the cleaning liquid nozzles 5501. The cleaning liquid nozzles 5501 are provided at positions facing the radial grooves 5109 in the protruding portion 5202 and supply the cleaning liquid toward the radial grooves 5109. The radial grooves 5109 are not necessarily required to extend strictly in the radial direction, and may extend forming an angle with respect to the radial direction.

Figure 4:
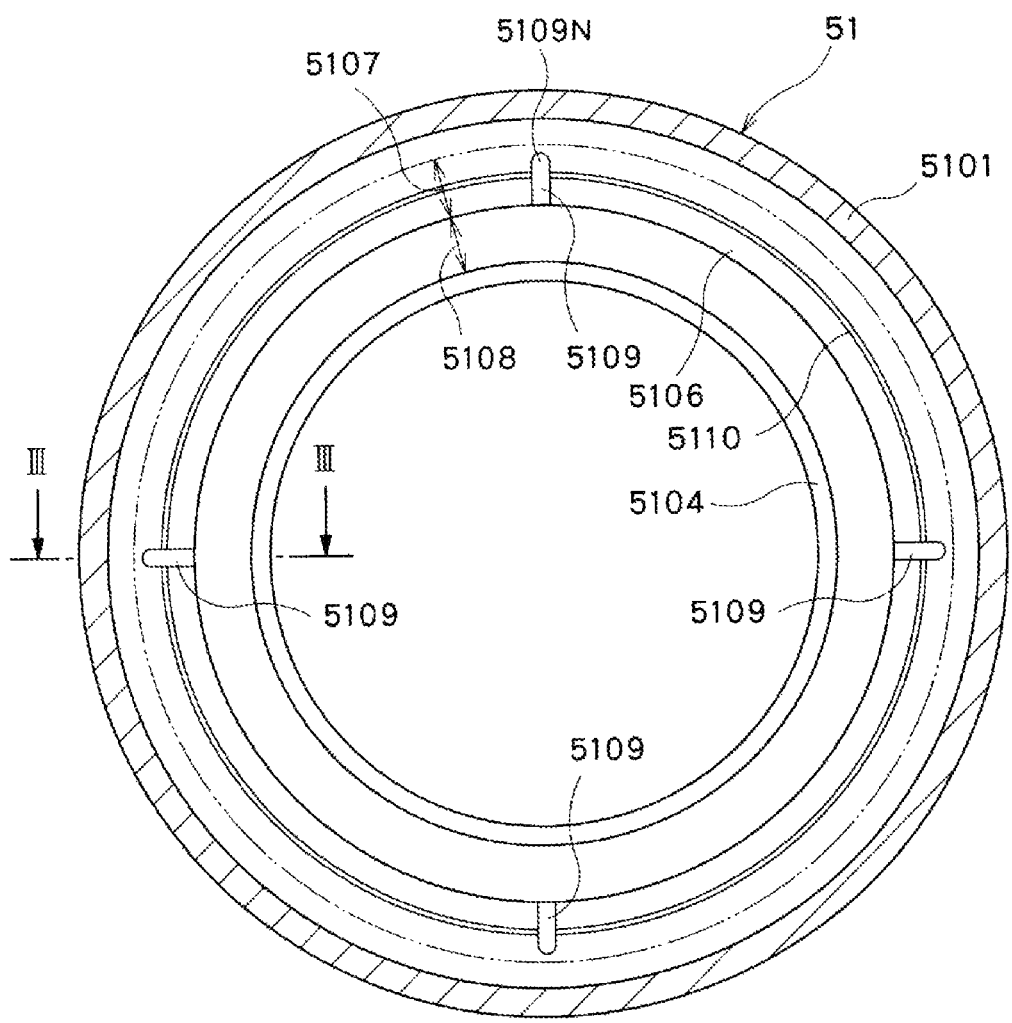
FIG. 4 is a sectional view obtained by cutting a first cup body along line IV-IV in FIG. 3 (FIG. 4 is also a bottom view of a protruding portion of the first cup body), in which a second cup body and a third cup body are not illustrated.

Each cleaning liquid nozzle 5501 is required to be positioned directly under the radial outer end of the corresponding radial groove 5109. In this case, in FIG. 4, the cleaning liquid nozzle 5501 is positioned directly under the radial outer end 5109N (the radial outer end of only one of the radial grooves 5109 is illustrated) of the radial groove 5109. However, each cleaning liquid nozzle 5501 may be positioned radially inside from the radial outer end of the corresponding radial groove 5109. Further, in FIG. 4, the circle indicated by the third alternate long and two short dashed line from the outside corresponds to the contour of the outer circumferential surface of the cylindrical portion 5201 of the second cup body 52.

A circumferentially extending circumference groove 5110 is formed radially inside from the position directly above each cleaning liquid nozzle 5501 in the gap forming portion 5106. The circumference groove 5110 crosses and communicates with all the radial grooves 5109. The circumference groove 5110 performs a role of circumferentially diffusing the cleaning liquid ejected from the cleaning liquid nozzles 5501. A plurality of circumference grooves 5110 may be concentrically formed in the gap forming portion 5106 within a radially outward area 5107.

Since the lower surface of the protruding portion 5202 of the second cup body 52 and the upper surface of the protruding portion 5302 of the third cup body 53 have the same configurations as those of the lower surface of the protruding portion 5102 of the first cup body 51 and the upper surface of the protruding portion 5202 of the second cup body 52, respectively, overlapping descriptions thereof will be omitted. Further, the reference numerals used for the components provided on the lower surface 5203 of the protruding portion 5202 of the second cup body 52 are different from those used for the components provided on the lower surface 5103 of the protruding portion 5102 of the first cup body 51, merely in terms of the numeral of the hundredth place in each reference numeral ("1" and "2"). Likewise, the reference numerals used for the components provided on the upper surface 5305 of the protruding portion 5302 of the third cup body 53 are different from those used for the components provided on the upper surface 5205 of the protruding portion 5202 of the second cup body 52, merely in terms of the numeral of the hundredth place in each reference numeral ("2" and "3"). The cleaning liquid nozzles 5501 are also provided in the protruding portion 5302 of the third cup body 53 in the same aspect as provided in the protruding portion 5202 of the second cup body 52.

A chamber exhaust port 62 is provided at a lower portion of the chamber 20 (the housing of the processing unit 16) outside the recovery cup 50 to exhaust the atmosphere in the chamber 20. A chamber exhaust line 64 is connected to the chamber exhaust port 62. A butterfly valve 66 is interposed in the chamber exhaust line 64.

The chamber exhaust line 64 is merged with the cup exhaust line 56. A switching valve 80 is provided in the cup exhaust line 56. According to the switching state of the switching valve 80, gas exhausted from the cup exhaust line 56 is discharged into any one of an acidic gas exhaust line 81, an alkaline gas exhaust line 82, and an organic gas exhaust line 83. Since each of the exhaust lines 81 to 83 has a negative pressure, the internal space of the recovery cup 50 and the internal space of the chamber 20 are sucked according to the switching state of the switching valve 80.

Next, the operation of the processing unit 16 which is automatically performed under the control by the control device 4 will be briefly described.

The wafer W is held and rotated by a substrate holding mechanism. Each of different kinds of processing liquids is supplied to the rotating wafer W from one of the processing liquid nozzles 41 to 43 according to a predetermined processing recipe. The vertical positions of the second cup body 52 and the third cup body 53 and the state of the switching valve 80 are switched according to the kind of the processing liquid supplied to the wafer W.

When an acidic chemical liquid cleaning process is performed, both the second cup body 52 and the third cup body 53 are disposed at the downwardly moved position (the position illustrated in the right side of FIG. 1) such that the first flow path 511 between the first cup body 51 and the second cup body 52 is opened. At this time, the acidic chemical liquid supplied from the processing liquid nozzle 41, and then, scattering from the rotating wafer W flows into the first flow path 511. Further, at this time, clean air supplied from the FFU 21 and present in the space above the wafer W flows into the recovery cup 50 to flow through the first flow path 511, and is exhausted from the cup exhaust port 55 to flow in the acidic gas exhaust line 81 through the cup exhaust line 56 and the switching valve 80.

At this time, a part of the acidic chemical liquid is changed into a mist form due to the collision with the wafer W or the collision with, for example, the first cup body 51, and the mist is carried along with the air current flowing through the first flow path 511 to flow toward the cup exhaust port 55. Most of the mist is caught by the wall body of the curved portion provided in the middle of the first flow path 511, and drops into the liquid receiver 512. Further, the acidic chemical liquid flowing down along the surfaces of the first cup body 51 and the second cup body 52 which face the first flow path 511 also drops into the liquid receiver 512. The acidic chemical liquid dropping into the liquid receiver 512 is discharged from the inside of the recovery cup 50 through the drain port 513.

Further, the gas present in the space around the recovery cup 50 in the internal space of the chamber 20 is exhausted from the chamber exhaust port 62, and flows in the acidic gas exhaust line 81 through the chamber exhaust line 64 and the switching valve 80.

When an alkaline chemical liquid cleaning process is performed, the second cup body 52 is disposed at the upwardly moved position, and the third cup body 53 is disposed at the downwardly moved position such that the second flow path 521 between the second cup body 52 and the third cup body 53 is opened. When an organic solvent cleaning process is performed, both the second cup body 52 and the third cup body 53 are disposed at the upwardly moved position such that the third flow path 531 between the third cup body 53 and the inner wall 54 is opened. When DIW is supplied from the nozzles 41 to 43, the second cup body 52 and the third cup body 53 are disposed at the same position as that when the processing liquid supplied immediately prior to the supply of the DIW was supplied. Since the flow aspect of the processing liquid in the second flow path 521 and the third flow path 531 is the same as the flow aspect of the processing liquid in the first flow path 511, overlapping descriptions thereof will be omitted.

As described above, when the processing liquid in the mist form flows through the first flow path 511, most of the processing liquid flows down to the corresponding drain port 513, but a part of the processing liquid is attached to the wall surfaces of the first cup body 51 and the second cup body 52 and remains on the wall surfaces. Especially, the processing liquid tends to remain on the lower surface 5103 of the protruding portion 5102 of the first cup body 51 and the upper surface 5205 of the protruding portion 5202 of the second cup body 52. The processing liquid contains a reaction product as well. When the processing liquid is dried so that a solid material is deposited on the lower surface 5103 or the upper surface 5205, and then, peeled off therefrom, this may cause the generation of particles. Hence, the lower surface 5103 and the upper surface 5205 are periodically cleaned. A time point for performing the "periodic" cleaning may be a time point when a predetermined number (one or a plurality of) of wafers W are processed after previous cleaning or a time point after a predetermined time elapses from previous cleaning.

Hereinafter, the method of cleaning the lower surface 5103 and the upper surface 5205 will be described. First, the second cup body 52 is moved upward to bring the protruding portion 5202 of the second cup body 52 into the second state where the protruding portion 5202 of the second cup body 52 is close to the protruding portion 5102 of the first cup body 51.

Next, the cleaning liquid is ejected from the cleaning liquid nozzle 5501. The cleaning liquid ejected from each cleaning liquid nozzle 5501 passes through the corresponding radial groove 5109, and flows into the relatively wide gap G2 between the protruding portion 5102 of the first cup body 51 and the protruding portion 5202 of the second cup body 52. The cleaning liquid flowing into the gap G2 circumferentially spreads within the gap G2. At this time, the flow rate of the cleaning liquid ejected from the cleaning liquid nozzle 5501 is set to be larger than the flow rate of the cleaning liquid flowing out into the gap between the cylindrical portion 5101 and the cylindrical portion 5201 through the gap G1. Therefore, the entire circumference of the gap G2 may be filled with the cleaning liquid. At this time, since the protrusion 5104 of the first cup body 51 is in contact with the upper surface 5205 of the second cup body 52, the cleaning liquid is hardly leaked out between the lower surface of the protrusion 5104 and the upper surface 5205 of the protruding portion 5202. Therefore, the entire circumferential area within the gap G2 may be uniformly filled with the cleaning liquid.

The protrusion 5104 of the first cup body 51 may not be in contact with the upper surface 5205 of the second cup body 52. In this case, the flow rate of the cleaning liquid ejected from the cleaning liquid nozzle 5501 is required to be larger than the sum of the flow rate of the cleaning liquid flowing out into the gap between the cylindrical portion 5101 and the cylindrical portion 5201 through the gap G1 and the flow rate of the cleaning liquid flowing out from the gap between the protrusion 5104 of the first cup body 51 and the upper surface 5205 of the second cup body 52.

Figure 5:
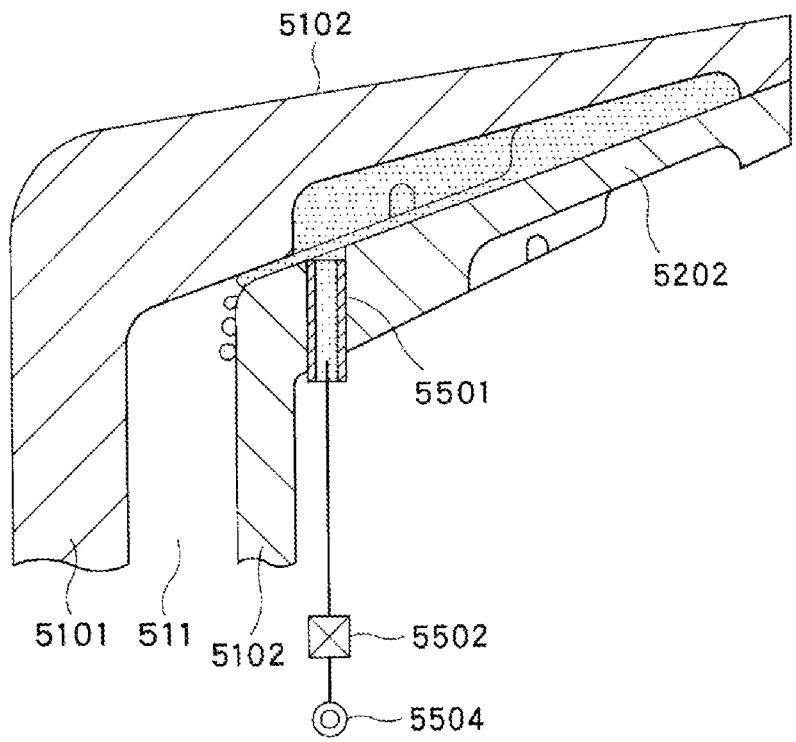
FIG. 5 is a sectional view illustrating a state where a cleaning liquid is filled between the first protruding portion and the second protruding portion.

The cleaning liquid flowing within the radial grooves 5109 also flows into the circumference groove 5110 and spreads circumferentially. When the gap G2, the radial grooves 5109, and the circumference groove 5110 are filled with the cleaning liquid, diffusion of the cleaning liquid into the gap G1 is proceeded with. Finally, the entire area (i.e., the gaps G1 and G2) between the protruding portion 5102 of the first cup body 51 and the protruding portion 5202 of the second cup body 52 is filled with the cleaning liquid. FIG. 5 illustrates this state, and the cleaning liquid is present in the dotted area. Attachments (e.g., a chemical liquid and a reaction product) attached to the lower surface 5103 of the protruding portion 5102 and the upper surface 5205 of the protruding portion 5202 are dissolved in the cleaning liquid. The attachments dissolved in the cleaning liquid are discharged into the gap between the cylindrical portion 5101 and the cylindrical portion 5201, along with the cleaning liquid. In this way, the lower surface 5103 of the protruding portion 5102 may be evenly cleaned. Further, the upper surface 5205 of the protruding portion 5202 may also be cleaned at the same time.

Thereafter, the second cup body 52 is moved downward to become the first state where the protruding portion 5202 of the second cup body 52 is spaced apart from the protruding portion 5102 of the first cup body 51. Accordingly, the cleaning liquid present between the protruding portion 5102 and the protruding portion 5202 flows radially outward along the inclination of the upper surface 5205 of the protruding portion 5202, and drops into the gap between the cylindrical portion 5101 and the cylindrical portion 5201. Finally, the cleaning liquid is discharged from the recovery cup 50. Accordingly, the cleaning is ended.

After the entire area of the space between the protruding portion 5102 and the protruding portion 5202 is filled with the cleaning liquid, the ejection of the cleaning liquid from the cleaning liquid nozzle 5501 may be continued for predetermined time before the first cup body 51 and the second cup body 52 are brought into the first state. Alternatively, the first cup body 51 and the second cup body 52 may be brought into the first state immediately after the entire area is filled with the cleaning liquid.

The ejection of the cleaning liquid from the cleaning liquid nozzles 5501 may be stopped before the first cup body 51 and the second cup body 52 are brought into the first state, or may be continued for predetermined time after the first cup body 51 and the second cup body 52 are brought into the first state.

Depending on the state of contamination, the process of filling the gaps G1 and G2 with the cleaning liquid by bringing the first cup body 51 and the second cup body 52 into the second state and the process of discharging the cleaning liquid from the gaps G1 and G2 by bringing the first cup body 51 and the second cup body 52 into the first state may be alternately and repeatedly performed a plurality of times.

In the descriptions above, the method of cleaning the lower surface 5103 of the first cup body 51 and the upper surface 5205 of the second cup body 52 has been described. However, the lower surface 5203 of the second cup body 52 and the upper surface 5305 of the third cup body 52 may also be cleaned in the same sequence as described above, and the same effect as described above is achieved. The operation to bring the second cup body 52 and the third cup body 53 into the first or second state may be performed by moving any one of the second cup body 52 and the third cup body 53.

According to the above-described exemplary embodiment, the gap G1 between the protruding portion 5102 and the protruding portion 5202 into which the cleaning liquid is supplied is made narrower than the gap G2. Accordingly, the movement of the cleaning liquid that, by the influence of the gravity, tends to flow radially outward along the upper surface 5205 of the protruding portion 5202 of the second cup body 52 that is inclined radially outward is greatly restricted, so that the entire area of the gap G2 may be thoroughly filled with the cleaning liquid. Since the entire circumference of the gap G2 is filled with the cleaning liquid, and then, the gap G1 which is narrower than the gap G2 is filled with the cleaning liquid by the gravity and the liquid pressure, the entire area of the gap G1 may be filled with the cleaning liquid. Therefore, the lower surface 5103 of the first cup body 51 may be evenly cleaned. Further, the upper surface 5205 of the second cup body 52 may also be evenly cleaned.

In addition, according to the above-described exemplary embodiment, the radial grooves 5109 are provided in the gap forming portion 5106, and the cleaning liquid nozzles 5501 supply the cleaning liquid toward the radial grooves. The cleaning liquid is preferentially sent to the wide gap G2 through the radial grooves 5109. Accordingly, since the cleaning liquid is sequentially filled in the gap G2 from the lowest position toward the high position thereof, the wide gap G2 may be uniformly filled with the cleaning liquid. Therefore, the lower surface 5103 of the first cup body 51 may be evenly and uniformly cleaned. Further, the upper surface 5205 of the second cup body 52 may also be evenly and uniformly cleaned.

In addition, according to the above-described exemplary embodiment, the circumference groove 5110 is provided radially inside from the radial position where the cleaning liquid nozzles 5501 are provided. Accordingly, the radial outward portion of the narrow gap G1 from the circumference groove 5110 may be filled with the cleaning liquid flowing down from the circumference groove 5110, rather than the cleaning liquid flowing down from the wide gap G2 by the gravity. By providing the circumference groove 5110, the entire area of the narrow gap G1 may be more evenly and effectively filled with the cleaning liquid. Therefore, the lower surface 5103 of the first cup body 51 may be more evenly and effectively cleaned. Further, the upper surface 5205 of the second cup body 52 may also be more evenly and effectively cleaned at the same time.

Figure 6:
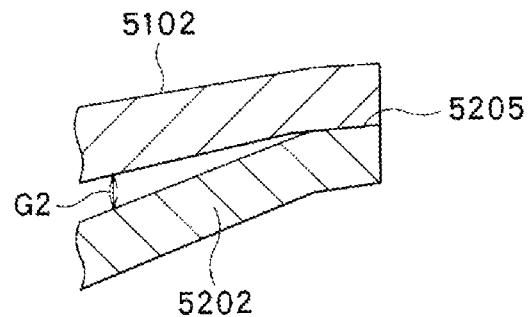
FIG. 6 is a sectional view illustrating other shapes of tip ends of the first protruding portion and the second protruding portion.

In the illustrated exemplary embodiment, the downward protrusions 5104 and 5204 are provided on the tip ends (the inner circumferential ends) of the protruding portion 5102 of the first cup body 51 and the protruding portion 5202 of the second cup body 52. However, the protrusions 5104 and 5204 may not be necessarily provided. For example, as illustrated in FIG. 6, even when no protrusions are provided, the protruding portions 5102 and 5202 may be formed such that, when the first cup body 51 and the second cup body 52 are in the second state, the tip end of the protruding portion 5102 is in contact with the upper surface 5205 of the protruding portion 5202, and the above-described gaps G1 and G2 are formed radially outside from the contact portion. The protruding portions 5202 and 5302 may also be in the same relation as described above.

Figure 7:
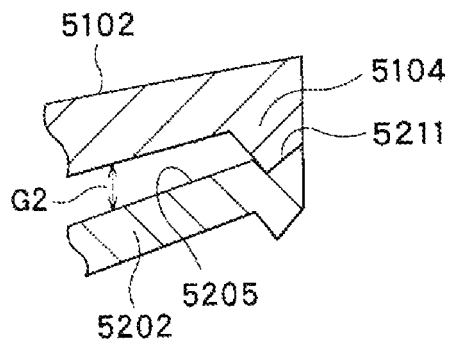
FIG. 7 is a sectional view illustrating still other shapes of the tip ends of the first protruding portion and the second protruding portion.

Alternatively, as illustrated in FIG. 7, a recess portion 5211 may be formed on the upper surface 5205 of the protruding portion 5202 to accommodate at least the lower end of the protrusion 5104 of the protruding portion 5202. With this configuration, the leakage of the cleaning liquid from the space between the protrusion 5104 and the upper surface 5205 to the radially inward side is less likely to occur, and thus, the liquid charging efficiency and the cleaning efficiency are improved. Likewise, although not illustrated, a recess portion may be formed on the upper surface 5305 of the protruding portion 5302 to accommodate at least the lower end of the protrusion 5204 of the protruding portion 5202.

Figure 8:
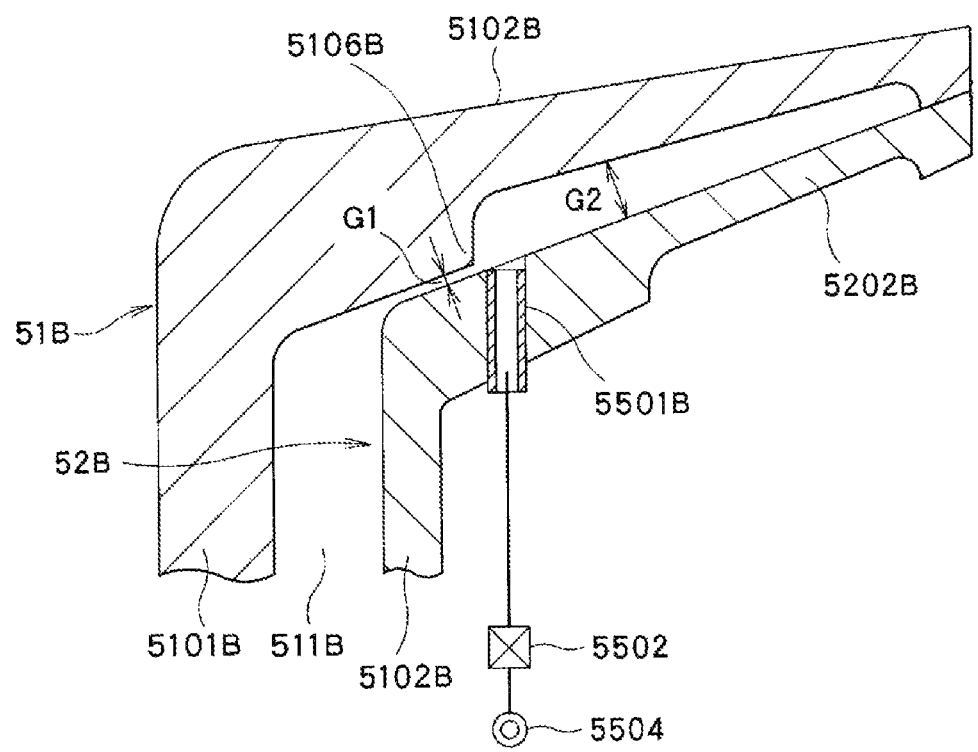
FIG. 8 is a sectional view illustrating another exemplary embodiment of the first protruding portion and the second protruding portion.

In the above-described exemplary embodiment, the radial grooves 5109 are formed in the gap forming portion 5106. However, the radial grooves 5109 may not be provided. In this case, as illustrated in FIG. 8, a cleaning liquid ejection nozzle 5501B is provided radially inside from a gap forming portion 5106B of a first cup body 51B in a second protruding portion 5202B. In this case as well, the entire circumference of the gap G2 positioned radially inside from the gap forming portion 5106B between the lower surface of a protruding portion 5102B of the first cup body 51B and the upper surface of the protruding portion 5202B of the second cup body 52B may be filled with the cleaning liquid supplied from the cleaning liquid ejection nozzle 5501B. Further, the entire circumference of the gap G1 between the lower surface of the gap forming portion 5106B and the upper surface of the protruding portion 5202B may also be filled with the cleaning liquid. The attachments dissolved in the cleaning liquid are discharged into the gap between a cylindrical portion 5101B and a cylindrical portion 5201B, along with the cleaning liquid. In this way, the lower surface of the first protruding portion 5102B may be cleaned.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a substrate holder that holds a substrate horizontally;
   a processing liquid nozzle that supplies a processing liquid to the substrate held by the substrate holder;
   a recovery cup that is provided around the substrate holder and includes a first cup body and a second cup body that receive the processing liquid scattering from the substrate, wherein the first cup body includes a first cylindrical portion and a first protruding portion that extends radially inward from a top end of the first cylindrical portion, the second cup body includes a second cylindrical portion and a second protruding portion that extends radially inward from a top end of the second cylindrical portion, the first cylindrical portion is positioned radially outside the second cylindrical portion, the first protruding portion is positioned above the second protruding portion, and an upper surface of the second protruding portion is inclined to ascend radially inward; and
   a lift that vertically moves at least one of the first cup body and the second cup body so as to take a first state where the first protruding portion and the second protruding portion are spaced apart from each other, and a second state where the first protruding portion and the second protruding portion are closer to each other than those in the first state,
   wherein, in the second state, a first gap is formed between a lower surface of the first protruding portion and the upper surface of the second protruding portion, a second gap is formed radially inside from the first gap between the lower surface of the first protruding portion and the upper surface of the second protruding portion, the first gap is narrower than the second gap, and
   the substrate processing apparatus further comprises a cleaning liquid nozzle that supplies a cleaning liquid to the second gap.

2. The substrate processing apparatus of claim 1, wherein the first protruding portion includes a radially extending radial groove that is formed on the lower surface thereof which corresponds to the first gap, to guide the cleaning liquid supplied from the cleaning liquid nozzle into the second gap.

3. The substrate processing apparatus of claim 2, wherein the cleaning liquid nozzle is provided at a position facing the radial groove in the second protruding portion.

4. The substrate processing apparatus of claim 2, wherein the first protruding surface includes a circumference groove that is formed on the lower surface thereof which corresponds to the first gap, to extend circumferentially while crossing the radial groove.

5. The substrate processing apparatus of claim 1, wherein, in the second state, a radial inner end of the first protruding portion and a radial inner end of the second protruding portion are in contact with each other.

6. The substrate processing apparatus of claim 4, wherein the first protruding portion includes a gap forming portion that is provided in a downwardly convex annular shape on the lower surface thereof such that the first gap is narrower than the second gap, and the radial groove and the circumference groove are formed in the gap forming portion.

7. A method of cleaning a substrate processing apparatus comprising: a substrate holder that holds a substrate horizontally; a processing liquid nozzle that supplies a processing liquid to the substrate held by the substrate holder; a recovery cup that is provided around the substrate holder and includes a first cup body and a second cup body that receive the processing liquid scattering from the substrate, wherein the first cup body includes a first cylindrical portion and a first protruding portion that extends radially inward from a top end of the first cylindrical portion, the second cup body includes a second cylindrical portion and a second protruding portion that extends radially inward from a top end of the second cylindrical portion, the first cylindrical portion is positioned radially outside the second cylindrical portion, the first protruding portion is positioned above the second protruding portion, and an upper surface of the second protruding portion is inclined to ascend radially inward; and a lift that vertically moves at least one of the first cup body and the second cup body so as to take a first state where the first protruding portion and the second protruding portion are spaced apart from each other, and a second state where the first protruding portion and the second protruding portion are closer to each other than those in the first state, wherein in the second state, a first gap is formed between a lower surface of the first protruding portion and the upper surface of the second protruding portion, a second gap is formed radially inside from the first gap between the lower surface of the first protruding portion and the upper surface of the second protruding portion, the first gap is narrower than the second gap, and the substrate processing apparatus further includes a cleaning liquid nozzle that supplies a cleaning liquid to the second gap, wherein the method comprises:
establishing the second state by vertically moving at least one of the first cup body and the second cup body; and
supplying the cleaning liquid from at least one cleaning liquid nozzle to the second gap.

8. The cleaning method of claim 7, wherein the first protruding portion includes at least one radially extending radial groove that is formed on the lower surface thereof which corresponds to the first gap, and
the supplying the cleaning liquid includes guiding the cleaning liquid supplied from the cleaning liquid nozzle into the second gap through the radial groove.

9. The cleaning method of claim 8, wherein the first protruding portion includes a plurality of radial grooves that are provided on the lower surface thereof, a plurality of cleaning liquid nozzles are provided at positions facing the plurality of radial grooves, respectively, and
the supplying the cleaning liquid includes guiding the cleaning liquid supplied from the plurality of cleaning liquid nozzles into the second gap through the corresponding radial grooves, respectively.

10. The cleaning method of claim 8, wherein the first protruding surface includes a circumference groove that is formed on the lower surface thereof which corresponds to the first gap, to extend circumferentially while crossing the radial groove, and
the supplying the cleaning liquid causing the cleaning liquid supplied from the at least one cleaning liquid nozzle to flow into the circumference groove and to be diffused circumferentially through the circumference groove.

11. The cleaning method of claim 7, wherein the establishing the second state includes causing a radial inner end of the first protruding portion and a radial inner end of the second protruding portion to be in contact with each other.

12. A non-transitory computer-readable storage medium storing a program that, when executed by a computer that controls an operation of a substrate processing apparatus, causes the computer to control the substrate processing apparatus so as to execute the method of cleaning the substrate processing apparatus of claim 7.

13. The substrate processing apparatus of claim 1, wherein a portion of the lower surface of the first protruding portion that forms the second gap is recessed relative to a portion of the lower surface of the first protruding portion that forms the first gap.

14. The cleaning method of claim 7, wherein a portion of the lower surface of the first protruding portion that forms the second gap is recessed relative to a portion of the lower surface of the first protruding portion that forms the first gap.

* * * * *